(12) United States Patent
Che et al.

(10) Patent No.: US 11,313,928 B2
(45) Date of Patent: Apr. 26, 2022

(54) COIL FOR RECEIVING MAGNETIC RESONANCE SIGNAL AND COIL ASSEMBLY THEREOF

(71) Applicant: SHANGHAI UNITED IMAGING HEALTHCARE CO., LTD., Shanghai (CN)

(72) Inventors: Shao Che, Shanghai (CN); Zhen Wang, Shanghai (CN)

(73) Assignee: SHANGHAI UNITED IMAGING HEALTHCARE CO., LTD., Shanghai (CN)

(*) Notice: Subject to any disclaimer, the term of this patent is extended or adjusted under 35 U.S.C. 154(b) by 70 days.

(21) Appl. No.: 16/446,096

(22) Filed: Jun. 19, 2019

(65) Prior Publication Data
US 2020/0072921 A1    Mar. 5, 2020

(30) Foreign Application Priority Data
Aug. 29, 2018  (CN) .......................... 201810993177.4

(51) Int. Cl.
*G01R 33/36* (2006.01)
*G01R 33/385* (2006.01)

(52) U.S. Cl.
CPC ..... *G01R 33/3628* (2013.01); *G01R 33/3664* (2013.01); *G01R 33/3852* (2013.01)

(58) Field of Classification Search
CPC ............ G01R 33/3628; G01R 33/3852; G01R 33/3664; G01R 33/3415; G01R 33/3657; G01R 33/34007; G01R 33/341; G01R 33/3642; G01R 33/385
See application file for complete search history.

(56) References Cited

U.S. PATENT DOCUMENTS

| 4,839,594 A * | 6/1989 | Misic ............... G01R 33/34046 324/318 |
| 6,847,210 B1 * | 1/2005 | Eydelman ............ G01R 33/341 324/318 |
| 9,678,180 B2 | 6/2017 | Yang et al. |

(Continued)

FOREIGN PATENT DOCUMENTS

WO     2018098265 A1    5/2018

OTHER PUBLICATIONS

Shreyas S. Vasanawala et al., Development and Clinical Implementation of Next Generation Very Light Weight and Extremely Flexible Receiver Arrays for Pediatric MRI, Physics, 2017, 22 pages.

(Continued)

*Primary Examiner* — Rishi R Patel
(74) *Attorney, Agent, or Firm* — Metis IP LLC

(57) ABSTRACT

A coil for receiving a magnetic resonance signal is provided. The coil may include a first conductor; and a second conductor electrically coupled to the first conductor. The second conductor may extend along the first conductor. The first conductor may have at least one first opening or the second conductor may have at least one second opening. The first conductor and the second conductor may be electrically coupled using an electronic component placed at the at least one first opening or the at least one second opening so that an electric current flows between the first conductor and the second conductor through the electronic component.

20 Claims, 14 Drawing Sheets

(56) References Cited

U.S. PATENT DOCUMENTS

| | | |
|---|---|---|
| 9,891,299 B1 | 2/2018 | Stormont |
| 10,690,737 B2 | 6/2020 | Yang et al. |
| 2007/0257676 A1 | 11/2007 | Sacher et al. |
| 2008/0204021 A1 | 8/2008 | Leussler et al. |
| 2014/0197832 A1* | 7/2014 | Driesel .................. H01Q 7/04 |
| | | 324/307 |
| 2018/0329005 A1 | 11/2018 | Sodickson et al. |
| 2018/0335491 A1* | 11/2018 | Yang .................. G01R 33/341 |
| 2018/0372817 A1 | 12/2018 | Rahmat-Samii et al. |
| 2019/0235034 A1* | 8/2019 | Greim ............. G01R 33/34007 |
| 2019/0310330 A1 | 10/2019 | Yang et al. |
| 2019/0310331 A1* | 10/2019 | Otake ............. G01R 33/34076 |
| 2019/0369176 A1 | 12/2019 | Dalveren et al. |
| 2019/0377040 A1 | 12/2019 | Stack et al. |

OTHER PUBLICATIONS

Michael D. Harpen, The Theory of Shielded Loop Resonators, Magnetic Resonance in Medicine, 32(16): 785-788, 1994.
Zhang, Bei et al., High Impedance Detector Arrays for Magnetic Resonance, Physics, 2017, 16 pages.

* cited by examiner

300B

500A

600A

600B

800

COIL FOR RECEIVING MAGNETIC RESONANCE SIGNAL AND COIL ASSEMBLY THEREOF

CROSS-REFERENCE TO RELATED APPLICATIONS

This application claims priority to Chinese Patent Application No. 201810993177.4, filed on Aug. 29, 2018, the contents of which are hereby incorporated by reference in its entirety.

TECHNICAL FIELD

The present disclosure generally relates to Magnetic Resonance (MR), and more specifically relates to a coil and/or a coil assembly for receiving an MR signal.

BACKGROUND

A magnetic resonance imaging (MRI) system is a medical imaging technique used to acquire data and reconstruct an image of the anatomy and/or a physiological process of a subject in both health and disease. Specifically, the subject is positioned within a detection space in a magnetic field generated by, e.g., a magnet. Protons (hydrogen atoms) are polarized and transmit an MR signal (e.g., a radio frequency (RF) signal), which is received by a receiving coil. The received MR signal may be used to reconstruct the image. The quality of a reconstructed image may be improved by increasing the intensity of the received MR signal. Accordingly, it may be desirable that resonance occurs between the transmitted MR signal and the received MR signal, i.e., a frequency of the transmitted MR signal and a frequency of the received MR signal are the same (i.e., a resonance frequency).

Current receiving coils are typically designed as a phased array. Each unit in the phased array may include a coil (e.g., an annular coil). A coil is typically made of copper, and typically in the form of a foil or a wire. The coils in the phased array can be fixed on a carrier on a rigid or flexible Printed Circuit Board (PCB). In order to form resonance, it is necessary to arrange an electronic component (e.g., a capacitor, an inductor) in series with the receiving coil. However, a local electric field exists between two ends of each of the electronic component. The local electric field can be coupled to a magnetic field generated by the magnet, resulting in dielectric loss and frequency offset of the magnet, and ultimately affecting a Signal-to-Noise Ratio (SNR) of the reconstructed image.

To solve the problem above, in some cases, a plurality of electronic components are uniformly distributed on the coil, thereby reducing the intensity of the electric field compared to that formed by a single electronic component. However, an electric field still exists between two ends of each of the plurality of distributed electronic components.

Additionally or alternatively, because the coil is a transmission line, the resonance may be brought about by making a length of the transmission line equal to a half of a wavelength corresponding to the resonance frequency, and thus the electronic component is unnecessary. However, in current MRI systems, the transmission line is relatively long, resulting in a receiving coil of a relatively large size, which makes it difficult to design coils suitable for examining different portions (e.g., the head, the chest, a leg) of the subject of different sizes. Thus, it is desirable to design a receiving coils that may facilitate the occurrence of resonance between the transmitted MR signal and the received MR signal, thereby improving the quality of a reconstructed image based on the MR data acquired this way.

SUMMARY

In a first aspect of the present disclosure, a coil for receiving a magnetic resonance signal is provided. The coil may include a first conductor and a second conductor. The second conductor may be electrically coupled to the first conductor and extend along the first conductor. The first conductor may have at least one first opening or the second conductor may have at least one second opening. The first conductor and the second conductor may be electrically coupled using an electronic component placed at the at least one first opening or the at least one second opening so that an electric current may flow between the first conductor and the second conductor through the electronic component.

In some embodiments, the electronic component may include at least one of a capacitor, an inductor, or a switching circuit.

In some embodiments, the coil may also include a second electronic component in series with the first conductor. The second electronic component may be configured to adjust a frequency of the received magnetic resonance signal.

In some embodiments, the second electronic component may include a capacitor, an inductor, or a switching circuit.

In some embodiments, a capacitance of the capacitor may be adjustable, or an inductance of the inductor may be adjustable.

In some embodiments, the second electronic component may be placed at one of the at least one first opening or one of the at least one second opening.

In some embodiments, the coil may also be electrically coupled to a third electronic component through one of the at least one first opening of the first conductor.

In some embodiments, the third electronic component may be electrically coupled to the first conductor through the first opening of the first conductor.

In some embodiments, the third electronic component may be electrically coupled to the second conductor through the at least one first opening of the first conductor.

In some embodiments, the third electronic component may include at least one of a matching circuit, an amplifier, or a switching circuit.

In some embodiments, the first conductor may have a shape of an arc, a rectangle, a butterfly shape, a saddle shape, an annular shape, a ring-like shape, or a polygon.

In some embodiments, the second conductor may have a shape of a hollow tube that wraps around the first conductor.

In some embodiments, the second conductor may include one or more conductive layers arranged parallel to the first conductor.

In some embodiments, a gap may exist between the first conductor and the second conductor.

In some embodiments, the gap may be filled with a dielectric medium.

In some embodiments, the dielectric medium may include at least one of air, ceramic, polymer, or crystalline material.

In some embodiments, a location of one of the at least one first opening relative to one of the at least one second opening may be adjustable.

In a second aspect of the present disclosure, a coil assembly for receiving a magnetic resonance signal is provided. The coil assembly may include a plurality of coils, and at least one of the plurality of coils may include a first conductor and a second conductor. The second conductor may be electrically coupled to the first conductor and extend along the first conductor. The first conductor may have at least one first opening or the second conductor may have at least one second opening. The first conductor and the second conductor may be electrically coupled using an electronic component placed at the at least one first opening or the at least one second opening so that an electric current may flow between the first conductor and the second conductor through the electronic component.

In some embodiments, the plurality of coils may form a planar shape, a dome shape, a cylindrical shape or an arc shape.

In a third aspect of the present disclosure, a magnetic resonance imaging system is provided. The magnetic resonance imaging system may include a magnet, a table, and a coil assembly. The magnet may be configured to form a detection space. The table may be configured to support a subject to be examined inside the detection space. The coil assembly may be configured to receive a magnetic resonance signal generated by the subject when the subject is examined. The coil assembly may include a plurality of coils, and at least one of the plurality of the coils may include a first conductor and a second conductor. The second conductor may be electrically coupled to the first conductor and extend along the first conductor. The first conductor may have at least one first opening or the second conductor may have at least one second opening. The first conductor and the second conductor may be electrically coupled using an electronic component placed at the at least one first opening or the at least one second opening so that an electric current may flow between the first conductor and the second conductor through the electronic component.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein.

DETAILED DESCRIPTION

Figure 1A:
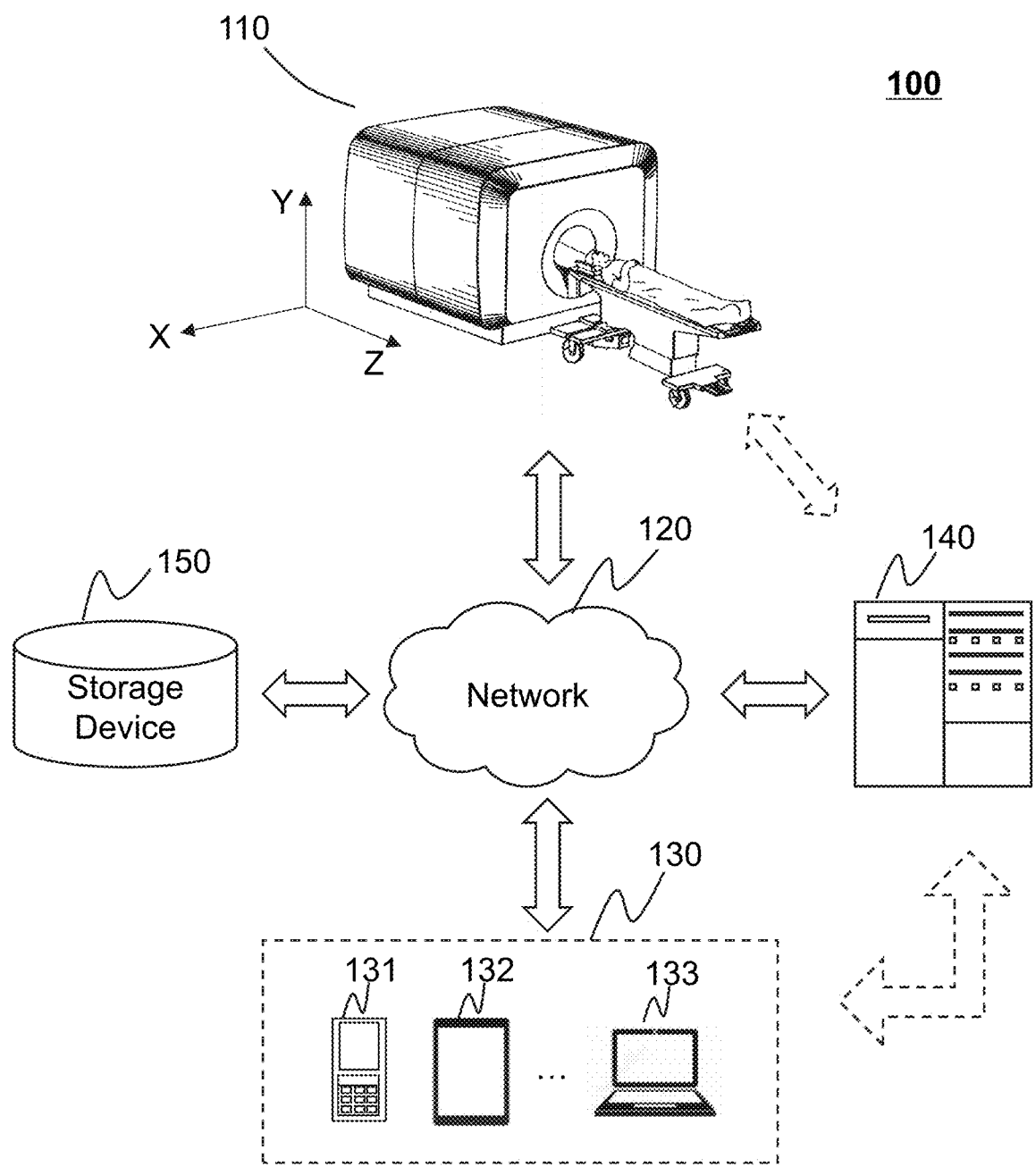
FIG. 1A is a schematic diagram illustrating an exemplary magnetic resonance imaging (MRI) system according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is to describe particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "unit," "module," and/or "block" used herein are one method to distinguish different components, elements, parts, section or assembly of different level in ascending order. However, the terms may be displaced by another expression if they achieve the same purpose.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage.

It will be understood that when a unit, engine, module or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The present disclosure relates to a coil for receiving an MR signal. The received MR signal may be used to reconstruct an image relating to a subject. The quality of a reconstructed image may be improved by increasing the intensity of the received MR signal which may reach a maximum when resonance exists between a transmitted MR signal by the subject and the received MR signal, i.e., a frequency of the transmitted MR signal and a frequency of the received MR signal are the same (i.e., a resonance frequency).

The coil may include a first conductor and a second conductor. The first conductor may have at least one first opening. Additionally or alternatively, the second conductor may have at least one second opening. The first conductor and the second conductor may be electrically coupled using an electronic component placed at the at least one first opening or the at least one second opening so that an electric current may flow between the first conductor and the second conductor through the electronic component. Thus, the first conductor and the second conductor may constitute a transmission line. The electric current may flow back and forth between the first conductor and the second conductor through the electronic component at the at least one first opening and/or the at least one second opening, a length of the transmission line may be greater than a total of a length of the first conductor and a length of the second conductor. For the same frequency, the size of the coil may be reduced, thereby reducing the cost and allowing for flexibly designing the receiving coils to suit for examining different portions (e.g., the head, the chest, a leg) of the subject of different sizes.

FIG. 1A is a schematic diagram illustrating an exemplary magnetic resonance imaging (MRI) system according to some embodiments of the present disclosure. As illustrated, the MRI system 100 may include an MRI scanner 110, a network 120, a terminal 130, a processing device 140, and a storage device 150. The components of the MRI system 100 may be connected in one or more of various ways. Mere by way of example, as illustrated in FIG. 1A, the MRI scanner 110 may be connected to the processing device 140 through the network 120. As another example, the MRI scanner 110 may be connected to the processing device 140 directly as indicated by the bi-directional arrow in dotted lines linking the MRI scanner 110 and the processing device 140. As a further example, the storage device 150 may be connected to the processing device 140 directly or through the network 120. As still a further example, a terminal device (e.g., 131, 132, 133, etc.) may be connected to the processing device 140 directly (as indicated by the bi-directional arrow in dotted lines linking the terminal 130 and the processing device 140) or through the network 120.

The MRI scanner 110 may scan a subject located within its detection space and generate a plurality of data (e.g., an MR signal, an image) relating to the subject. In the present disclosure, "subject" and "object" are used interchangeably. The subject may include a biological subject (e.g., a human, an animal), a non-biological subject (e.g., a phantom), etc. In some embodiments, the subject may include a specific portion, organ, and/or tissue of the subject. For example, the subject may include head, brain, neck, body, shoulder, arm, thorax, cardiac, stomach, blood vessel, soft tissue, knee, feet, or the like, or any combination thereof. In some embodiments, the MRI scanner 110 may be a closed-bore scanner or an open-bore scanner.

In the present disclosure, the X axis, the Y axis, and the Z axis shown in FIG. 1A may form an orthogonal coordinate system. The X axis and the Z axis shown in FIG. 1A may be horizontal, and the Y axis may be vertical. As illustrated, the positive X direction along the X axis may be from the right side to the left side of the MRI scanner 110 seen from the direction facing the front of the MRI scanner 110; the positive Y direction along the Y axis shown in FIG. 1A may be from the lower part to the upper part of the MRI scanner 110; the positive Z direction along the Z axis shown in FIG. 1A may refer to a direction in which the subject is moved out of the scanning channel (or referred to as the bore) of the MRI scanner 110.

Figure 1B:
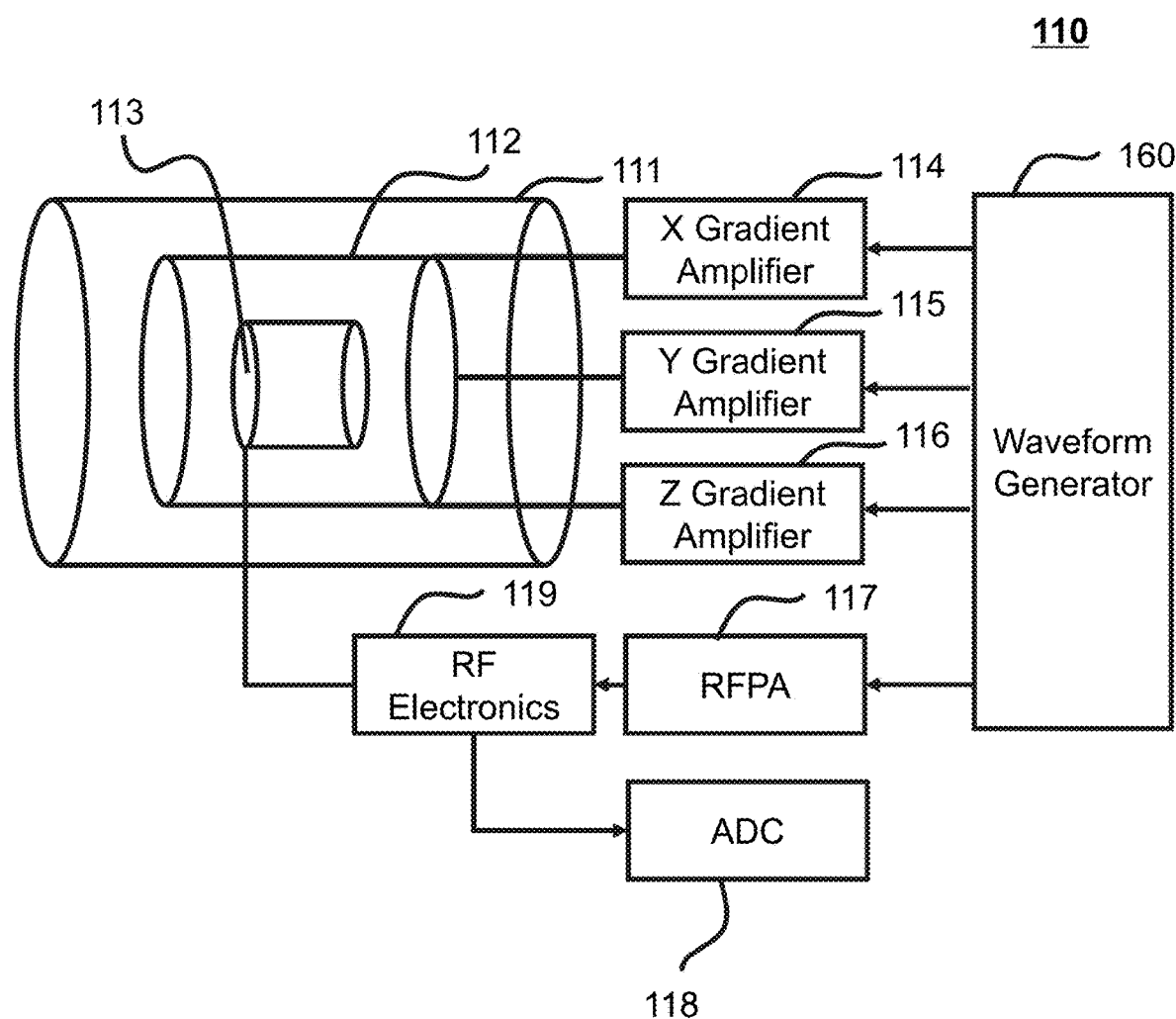
FIG. 1B is a schematic diagram illustrating an exemplary MRI scanner according to some embodiments of the present disclosure.

FIG. 1B is a schematic diagram illustrating an exemplary MRI scanner according to some embodiments of the present disclosure. As illustrated, the magnet 111 may generate a first magnetic field (also referred to as "main magnetic field"). The magnet 111 may include a resistive magnet or a superconductive magnet that both need a power supply (not shown) for operation. Alternatively, the magnet 111 may include a permanent magnet. The magnet 111 may include a bore that the subject is placed within. The magnet 111 may also control the homogeneity of the generated main magnetic field. Some shim coils may be in the magnet 111. The shim coils placed in the gap of the magnet 111 may compensate for the inhomogeneity of the magnetic field of the magnet 111. The shim coils may be energized by a shim power supply.

Gradient coils 112 may be located inside the magnet 111. The gradient coils 112 may generate a second magnetic field (or referred to as a gradient field, including gradient fields Gx, Gy, and Gz). The second magnetic field may be superimposed on the main field generated by the magnet 111 and distort the main field so that the magnetic orientations of the protons of a subject may vary as a function of their positions inside the gradient field, thereby encoding spatial information into MR signals generated by the region of the subject being imaged. The gradient coils 112 may include X coils (e.g., configured to generate the gradient field Gx corresponding to the X direction), Y coils (e.g., configured to generate the gradient field Gy corresponding to the Y direction), and/or Z coils (e.g., configured to generate the gradient field Gz corresponding to the Z direction) (not shown in FIG. 1B). In some embodiments, the Z coils may be designed based on circular (Maxwell) coils, while the X coils and the Y coils may be designed on the basis of the saddle (Golay) coil configuration. The three sets of coils may generate three different magnetic fields that are used for position encoding. The gradient coils 112 may allow spatial encoding of MR signals for image construction. The gradient coils 112 may be connected with one or more of an X gradient amplifier 114, a Y gradient amplifier 115, or a Z gradient amplifier 116. One or more of the three amplifiers may be connected to a waveform generator 160. The waveform generator 160 may generate gradient waveforms that are applied to the X gradient amplifier 114, the Y gradient amplifier 115, and/or the Z gradient amplifier 116. An amplifier may amplify a waveform. An amplified waveform may be applied to one of the coils in the gradient coils 112 to generate a magnetic field in the X-axis, the Y-axis, or the Z-axis, respectively. The gradient coils 112 may be designed for either a close-bore MRI scanner or an open-bore MRI scanner. In some instances, all three sets of coils of the gradient coils 112 may be energized and three gradient fields may be generated thereby. In some embodiments of the present disclosure, the X coils and Y coils may be energized to generate the gradient fields in the X direction and the Y direction. As used herein, the X-axis, the Y-axis, the Z-axis, the X direction, the Y direction, and the Z direction in the description of FIG. 1B are the same as or similar to those described in FIG. 1A.

In some embodiments, radio frequency (RF) coils 113 may be located inside the magnet 111 and serve as transmitters, receivers (also referred to as "receiving coil"), or both. The RF coils 113 may be in connection with RF electronics 119 that may be configured or used as one or more integrated circuits (ICs) functioning as a waveform transmitter and/or a waveform receiver. The RF electronics 119 may be connected to a radiofrequency power amplifier (RFPA) 207 and an analog-to-digital converter (ADC) 208.

When used as transmitters, the RF coils 113 may generate RF signals that provide a third magnetic field that is utilized to generate MR signals related to the region of the subject being imaged. The third magnetic field may be perpendicular to the main magnetic field. The waveform generator 160 may generate an RF pulse. The RF pulse may be amplified by the RFPA 117, processed by the RF electronics 119, and applied to the RF coils 113 to generate the RF signals in response to a powerful current generated by the RF electronics 119 based on the amplified RF pulse.

When used as receivers, the RF coils may be responsible for detecting MR signals (e.g., echoes). After excitation, the MR signals generated by the subject may be sensed by the RF coils 113. The receive amplifier then may receive the sensed MR signals from the RF coils 113, amplify the sensed MR signals, and provide the amplified MR signals to the ADC 118. The ADC 118 may transform the MR signals from analog signals to digital signals. The digital MR signals then may be sent to the processing device 140 for sampling.

In some embodiments, the gradient coils 112 and the RF coils 113 may be circumferentially positioned with respect to the subject. It is understood by those skilled in the art that the magnet 111, the gradient coils 112, and the RF coils 113 may be situated in a variety of configurations around the subject.

In some embodiments, the RFPA 117 may amplify an RF pulse (e.g., the power of the RF pulse, the voltage of the RF pulse) such that an amplified RF pulse is generated to drive the RF coils 113. The RFPA 117 may include a transistor-based RFPA, a vacuum tube-based RFPA, or the like, or any combination thereof. The transistor-based RFPA may include one or more transistors. The vacuum tube-based RFPA may include a triode, a tetrode, a klystron, or the like, or any combination thereof. In some embodiments, the RFPA 117 may include a linear RFPA, or a nonlinear RFPA. In some embodiments, the RFPA 117 may include one or more RFPAs.

In some embodiments, the MRI scanner 110 may further include a subject positioning system (not shown). The subject positioning system may include a subject cradle and a transport device. The subject may be placed on the subject cradle and be positioned by the transport device within the bore of the magnet 111.

In some embodiments, at least one of the RF coils 113 may include a first conductor and a second conductor. The second conductor may extend by the side of the first conductor to provide a compact structure of the coil. The second conductor may be electrically coupled to the first conductor. The first conductor may have at least one first opening. The second conductor may have at least one second opening. The first conductor and the second conductor may be electrically coupled using an electronic component placed at the at least one first opening or the at least one second opening so that an electric current may flow between the first conductor and the second conductor through the electronic component.

When the first conductor is electrically coupled to the second conductor, the first conductor and the second conductor may collectively constitute a transmission line. The transmission line may be configured with a distributed resistance and a distributed inductance. The distributed resistance may be (substantially) evenly distributed along the length of the transmission line. Additionally or alternatively, the distributed inductance may be (substantially) evenly distributed along the length of the transmission line. In some embodiments, the length of the transmission line may be associated with a path along which the electric current flows.

The quality of a reconstructed image may be improved by increasing the intensity of the received MR signal. Accordingly, it may be desirable that resonance occurs between the transmitted MR signal and the received MR signal, i.e., a frequency of the transmitted MR signal and a frequency of the received MR signal are the same frequency (i.e., a resonance frequency).

In some embodiments, the frequency of the transmitted MR signal may be associated with an intensity of the magnetic field of the magnet. The greater the intensity is, the greater the frequency of the transmitted MR signal may be. For illustration purposes, if the intensity of the magnet is 1.5 T, the frequency of the MR signal transmitted by the protons may be 64 Hz. If the intensity of the magnet is 3 T, the frequency of the MR signal transmitted by the protons may be 128 Hz.

In order for resonance to occur between the MR signal transmitted by the subject and the MR signal received by the coil, the frequency of the received MR signal may need to be adjusted to be equal to the frequency of the transmitted MR signal. For illustration purposes, ways of adjusting the frequency of the received MR signal may include adjusting the size of a receiving coil, adjusting the length of the path along which an electric current flows through a first conductor and a second conductor (e.g., adjusting the number (or count) of openings, adjusting the position(s) of the opening(s)), adding an additional electronic component, or the like, or a combination thereof. More detailed descriptions can be found elsewhere in the present disclosure. See, e.g., FIGS. 3A-4B, and the descriptions thereof.

Back to FIG. 1A, the network 120 may include any suitable network that can facilitate the exchange of information and/or data for the MRI system 100. In some embodiments, one or more components of the MRI system 100 (e.g., the MRI scanner 110, the terminal 130, the processing device 140, or the storage device 150) may communicate information and/or data with one or more other components of the MRI system 100 via the network 120. For example, the processing device 140 may obtain the received MR signal from the MRI scanner 110 via the network 120. In some embodiments, the network 120 may be any type of wired or wireless network, or a combination thereof. The network 120 may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, switches, server computers, and/or any combination thereof. Merely by way of example, the network 120 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 120 may include one or more network access points. For example, the network 120 may include wired and/or wireless network access points such as base stations and/or internet exchange points through which one or more components of the MRI system 100 may be connected to the network 120 to exchange data and/or information.

The terminal 130 include a mobile device 131, a tablet computer 132, a laptop computer 133, or the like, or any combination thereof. In some embodiments, the mobile device 131 may include a smart home device, a wearable device, a smart mobile device, a virtual reality device, an augmented reality device, or the like, or any combination thereof. In some embodiments, the smart home device may include a smart lighting device, a control device of an intelligent electrical apparatus, a smart monitoring device, a smart television, a smart video camera, an interphone, or the like, or any combination thereof. In some embodiments, the wearable device may include a smart bracelet, smart footgear, a pair of smart glasses, a smart helmet, a smart watch, smart clothing, a smart backpack, a smart accessory, or the like, or any combination thereof. In some embodiments, the smart mobile device may include a smartphone, a personal digital assistant (PDA), a gaming device, a navigation device, a point of sale (POS) device, or the like, or any combination thereof. In some embodiments, the virtual reality device and/or the augmented reality device may include a virtual reality helmet, a virtual reality glass, a virtual reality patch, an augmented reality helmet, an augmented reality glass, an augmented reality patch, or the like, or any combination thereof. For example, the virtual reality device and/or the augmented reality device may include a Google™ Glass, an Oculus Rift, a Hololens, a Gear VR, etc. In some embodiments, the terminal 130 may remotely operate the MRI scanner 110 and/or the processing device 140. In some embodiments, the terminal 130 may operate the MRI scanner 110 and/or the processing device 140 via a wireless connection. In some embodiments, the terminal 130 may receive information and/or instructions inputted by a user, and send the received information and/or instructions to the MRI scanner 110 or to the processing device 140 via the network 120. In some embodiments, the terminal 130 may receive data and/or information from the processing device 140. In some embodiments, the terminal 130 may be part of the processing device 140. In some embodiments, the terminal 130 may be omitted.

The processing device 140 may process data and/or information obtained from the MRI scanner 110, the terminal 130, and/or the storage device 150. For example, the processing device 140 may process an MR signal generated by the scanner 110 and encode the MR signal for reconstructing an image. As another example, the processing device 140 may determine a lesion (e.g., a tumor) in the reconstructed image and determine a treatment plan associated with the lesion based on the reconstructed image. In some embodiments, the processing device 140 may be a single server or a server group. The server group may be centralized, or distributed. In some embodiments, the processing device 140 may be local or remote. For example, the processing device 140 may access information and/or data stored in or acquired by the MRI scanner 110, the terminal 130, and/or the storage device 150 via the network 120. As another example, the processing device 140 may be directly connected to the MRI scanner 110 (as illustrated by the bidirectional arrow in dashed lines connecting the processing device 140 and the MRI scanner 110 in FIG. 1A), the terminal 130 (as illustrated by the bidirectional arrow in dashed lines connecting the processing device 140 and the terminal 130 in FIG. 1A), and/or the storage device 150 to access stored or acquired information and/or data. In some embodiments, the processing device 140 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

The storage device 150 may store data and/or instructions. In some embodiments, the storage device 150 may store data obtained from the MRI scanner 110, the terminal 130 and/or the processing device 140. For example, the processing device 140 may generate a reconstructed image based on received MR signals obtained from the MRI scanner 110, and then the reconstructed image may be stored in the storage device 150 for further use or processing. In some embodiments, the storage device 150 may store data obtained from the terminal 130 and/or the processing device 140. In some embodiments, the storage device 150 may store data and/or instructions that the processing device 140 may execute or use to perform exemplary methods described in the present disclosure. In some embodiments, the storage device 150 may include a mass storage device, a removable storage device, a volatile read-and-write memory, a readonly memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memory may include a random access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage device 150 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 150 may be connected to the network 120 to communicate with one or more components of the MRI system 100 (e.g., the MRI scanner 110, the processing device 140, the terminal 130, etc.). One or more components of the MRI system 100 may access the data or instructions stored in the storage device 150 via the network 120. In some embodiments, the storage device 150 may be directly connected to or communicate with one or more components of the MRI system 100 (e.g., the MRI scanner 110, the processing device 140, the terminal 130, etc.). In some embodiments, the storage device 150 may be part of the processing device 140.

In some embodiments, the MRI system 100 may further include one or more power supplies (not shown in FIG. 1A) connected to one or more components of the MRI system 100 (e.g., the MRI scanner 110, the processing device 140, the terminal 130, the storage device 150, etc.).

This description is intended to be illustrative, and not to limit the scope of the present disclosure. Many alternatives, modifications, and variations may be apparent to those skilled in the art. The features, structures, methods, and characteristics of the exemplary embodiments described herein may be combined in various ways to obtain additional and/or alternative exemplary embodiments. However, those variations and modifications do not depart the scope of the present disclosure.

Provided herein are systems and components for medical imaging and/or medical treatment. In some embodiments, the medical system may include an imaging system. The imaging system may include a single modality imaging system and/or a multi-modality imaging system. The single modality imaging system may include, for example, a magnetic resonance imaging (MRI) system. Exemplary MRI systems may include a superconducting magnetic resonance imaging system, a non-superconducting magnetic resonance imaging system, etc. The multi-modality imaging system may include, for example, a computed tomography-magnetic resonance imaging (MRI-CT) system, a positron emission tomography-magnetic resonance imaging (PET-MRI) system, a single photon emission computed tomography-magnetic resonance imaging (SPECT-MRI) system, a digital subtraction angiography-magnetic resonance imaging (DSA-MRI) system, etc. In some embodiments, the medical system may include a treatment system. The treatment system may include a treatment plan system (TPS), image-guide radiotherapy (IGRT), etc. The image-guide radiotherapy (IGRT) may include a treatment device and an imaging device. The treatment device may include a linear accelerator, a cyclotron, a synchrotron, etc., configured to perform a radio therapy on a subject. The treatment device may include an accelerator of species of particles including, for example, photons, electrons, protons, or heavy ions. The imaging device may include an MRI scanner, a CT scanner (e.g., cone beam computed tomography (CBCT) scanner), a digital radiology (DR) scanner, an electronic portal imaging device (EPID), etc.

For illustration purposes, the disclosure describes systems and methods for MRI medical applications (e.g., MRI imaging, MRI guided radiotherapy treatment, etc.). It should be noted that the MRI system 100 described below is merely provided for illustration purposes, and not intended to limit the scope of the present disclosure.

In the present disclosure, the coil may include a first conductor and a second conductor. In some embodiments, the first conductor may be arranged to form a shape. Merely by way of example, the shape may include an arc, a rectangle, a butterfly shape, a saddle shape, an annular shape, a ring-like shape, a polygon, or the like, or a combination thereof. The second conductor may extend alongside the first conductor. Such an arrangement may provide a compact size of the coil. The first conductor and the second conductor may be arranged to form a structure. The structure may include a coaxial structure, a microstrip structure, etc.

Figure 2A:
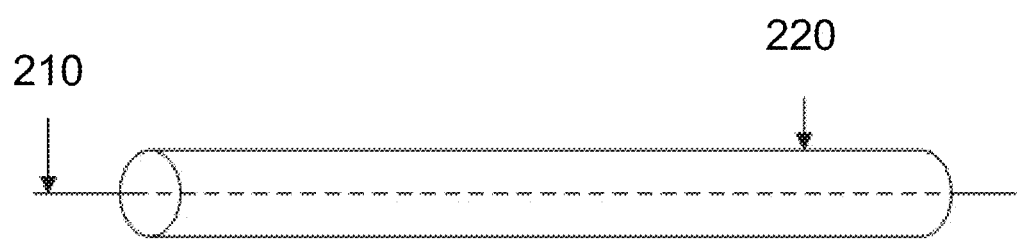
FIGS. 2A-2B are exemplary structures of coils for receiving an MR signal according to some embodiments of the present disclosure.
Figure 2B:
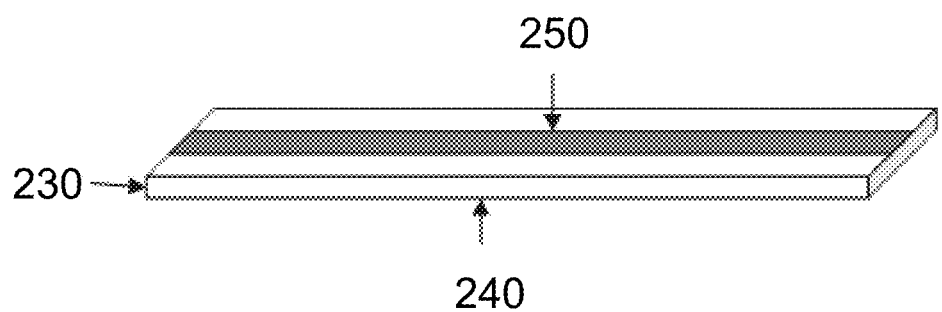

FIGS. 2A-2B are exemplary structures of coils for receiving an MR signal according to some embodiments of the present disclosure.

As shown in FIG. 2A, a first conductor 210 and a second conductor 220 may collectively form a coaxial structure. The first conductor 210 may be situated at a center region of the coaxial structure. The second conductor 220 may wrap around the first conductor 210.

As shown in FIG. 2B, a first conductor (i.e., a bottom layer 240) and a second conductor (i.e., an upper layer 250) may collectively form a microstrip structure. The first conductor may be arranged as the bottom layer 240 (i.e., a ground end) of the microstrip structure. The second conductor may be arranged as the upper layer 250 (i.e., a signal end) of the microstrip structure.

In some embodiments, a gap between the first conductor and the second conductor may be filled with an electrically insulating material, and accordingly form an electrically insulating layer 230. For example, the electrically insulating material may include plastic, glass, resin, rubber, or the like, or any combination thereof.

In some embodiments, the gap between the first conductor and the second conductor may be filled with a dielectric material. For example, the dielectric material may include air, ceramics, polymer, crystalline material (e.g., silicon, diamond, sulfur), or the like, or a combination thereof.

In some embodiments, the second conductor may be electrically coupled to the first conductor. In some embodiments, the second conductor may be electrically coupled to the first conductor through an electronic component, e.g., a capacitor, an inductor, a switching circuit, etc. An electric current may thus flow between the first conductor and the second conductor, and the first conductor and the second conductor may constitute a transmission line. A length of the transmission line may be associated with a path along which the electric current flows. In some embodiments, the length may be a length of the path along which the electric current flows. If the electric current directly flows from the first conductor to the second conductor (or vice versa), the length of the transmission line may be a total (also referred to as "total length") of a length of the first conductor and a length of the second conductor. If the electric current flows back and forth between the first conductor and the second conductor, the length of the transmission line may be greater than the total length.

In some embodiments, the first conductor may have at least one first opening and/or the second conductor may have at least one second opening. The first conductor and the second conductor may be electrically coupled using the electronic component placed at the at least one first opening or the at least one second opening, and the electric current may flow back and forth between the first conductor and the second conductor. For illustration purposes, the electric current may flow from a point of the first conductor to one first opening of the at least one first opening (e.g., in the clockwise direction, in the anticlockwise direction), then flow through the first opening and then the second conductor (e.g., in the anticlockwise direction, in the clockwise direction), further flow through one second opening of the at least one second opening and through the first conductor (e.g., in the anticlockwise direction, in the clockwise direction), and so on.

Figure 3A:
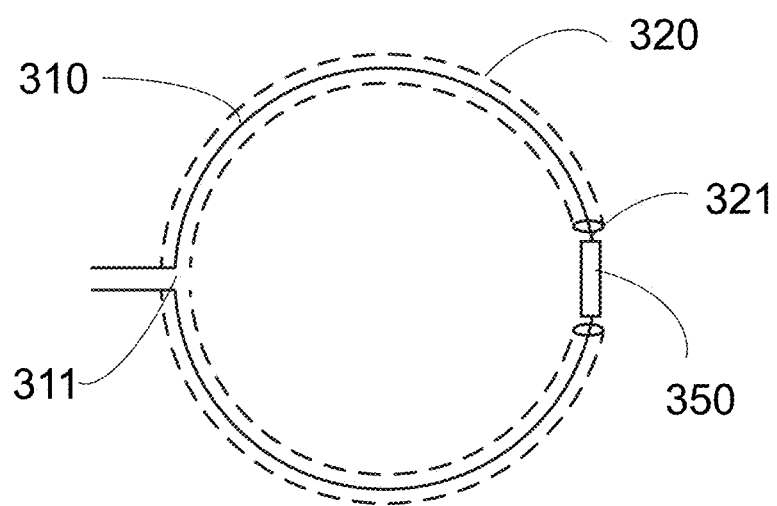
FIGS. 3A-3B are sectional views of exemplary coils for receiving an MR signal according to some embodiments of the present disclosure.
Figure 3B:
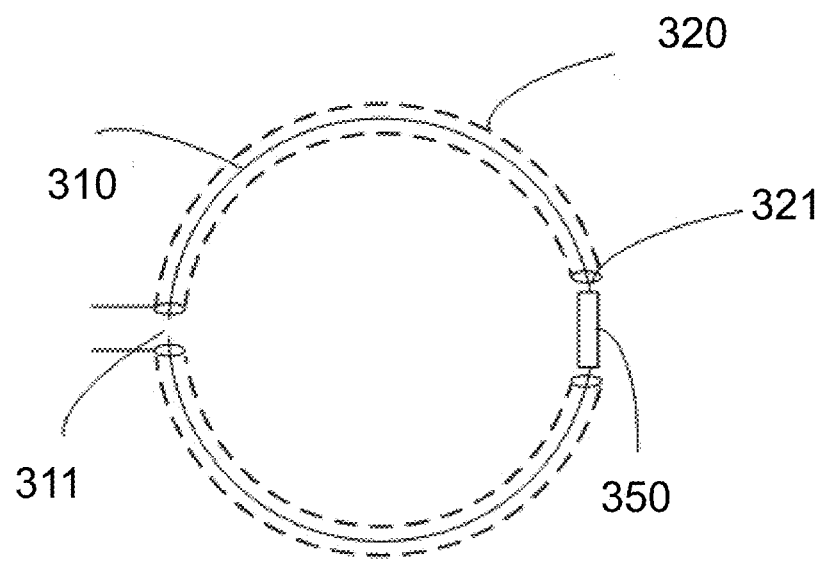

FIGS. 3A-3B are sectional views of exemplary coils for receiving an MR signal according to some embodiments of the present disclosure. The coil 300A and the coil 300B may have a coaxial structure described in connection with FIG. 2A. The coil 300A or the coil 300B may include a first conductor 310, a first opening 311, a second conductor 320, a second opening 321, and a second electronic component 350. The first conductor 310 and the second conductor 320 may collectively form the coaxial structure described above in connection with FIG. 2A.

The first conductor 310 may be arranged along a specific direction (e.g., a clockwise direction, an anticlockwise direction) to form the shape of an arc. The second conductor 320 may include one or more conductive layers forming a hollow tube wrapping around the first conductor 310. The second conductor 320 (i.e., the plurality of layers) may be arranged in parallel with the first conductor 310. That is, the second conductor 320 does not intersect with the first conductor 310.

As shown in FIGS. 3A-3B, the one or more conductive layers may be arranged on two sides (e.g., an inner side, an outer side) of the first conductor 310. In some embodiments, the plurality of conductive layers may be arranged on the same side (e.g., the inner side, the outer side) of the first conductor 310. The second conductor 320 may have the shape of a hollow tube that wraps around the first conductor 310. A gap between the first conductor 310 and the second conductor 320 may be filled with an electrically insulating material. For example, the electrically insulating material may include plastic, glass, resin, rubber, or the like, or any combination thereof.

The second conductor 320 may have the second opening 321. In some embodiments, the second conductor 320 may partially cover the first conductor 310, and the first conductor 310 may be partially exposed through the second opening 321. For illustration purposes, the second conductor 320 may include a first electrically conductive layer and a second electrically conductive layer. The first electrically conduct layer and the second electrically conductor layer may be adjacently distributed on the same side (e.g., the inner side, the outer side) of the first conductor 310. The first electrically conductive layer and the second electrically conductive layer may partially cover the first conductor 210 such that a portion of the first conductor 210 is not covered by either the first electrically conductive layer or the second electrically conductive layer.

As described in FIGS. 2A-2B, the second conductor 320 may be electrically coupled to the first conductor 310 and extend along the first conductor 310. The second conductor 320 and the first conductor 310 may be electrically coupled using an electronic component placed at the first opening 311 or the second opening 321. As shown in FIG. 3A or 3B, the second electronic component 350 may be placed at the second opening 321, and the second electronic component 350 may also be used as the electronic component, i.e., the second electronic component 350 may be configured to adjust an operating frequency of the coil 300A or coil 300B (i.e., the frequency of the received MR signal) and electrically couple the first conductor 310 and the second conductor 320.

The first conductor 310 may have the first opening 311, and thus have a first end and a second end. As shown in FIG. 3A, the first conductor 310 may be electrically coupled to a third electronic component (not shown) through the first opening 311. As shown in FIG. 3B, the second conductor 320 may have the first opening 311. The second conductor 320 may be electrically coupled to the third electronic component (not shown) that is the same as or similar to that described above through the first opening 311.

The third electronic component may be configured to adjust a state (e.g., a resonant state, a detuned state) of the coil 300A or 300B with respect to the transmitted MR signal. In some embodiments, when the MR signal is transmitted, the coil 300A or coil 300B may be in the detuned state with respect to the transmitted MR signal, and the coil 300A or coil 300B does not work. When the MR signal is received by the coil 300A or coil 300B that is in the resonant state with respect to the transmitted MR signal, the coil 300A or coil 300B may work, i.e., receive the MR signal. More detailed descriptions of the third electronic component can be found elsewhere in the present disclosure. See, e.g., FIGS. 7A-8 and the descriptions thereof.

In some embodiments, the coil 300A and/or 300B may be arranged as a circle whose diameter may be within the range of 5 centimeters and 20 centimeters. In some embodiments, the second conductor 320 may be in the form of a hollow tube whose radius may be within the range of 0.1 millimeters and 5 millimeters. One or more parameters of the coil 300A or coil 300B may be fixed or adjustable based on practical demands.

The first conductor 310 and the second conductor 320 may be electrically coupled so that the first conductor 310 and the second conductor 320 may constitute a transmission line. As described in FIG. 1A, in order for resonance to occur between the MR signal transmitted by the subject and the MR signal received by the coil, the frequency of the received MR signal may be adjusted to be equal to the frequency of the transmitted MR signal. For illustration purposes, ways of adjusting the frequency of the received MR signal may include adjusting the size of a receiving coil, adjusting a path along which an electric current flows through a first conductor and a second conductor, adding an additional electronic component, or the like, or a combination thereof. As shown in FIGS. 3A-3B, the second electronic component 350 may be an example of the additional electronic component. The first conductor 310 may be in series with the second electronic component 350. The second electronic component 350 may be configured to adjust the frequency of the received MR signal. Merely by way of example, the second electronic component 350 may include a capacitor (e.g., a capacitor 430 as described in FIG. 4A or 4B), an inductor (e.g., an inductor 440 as descried in FIG. 4A or 4B), a switching circuit (e.g., an inductor 440 as descried in FIG. 5A or FIG. 5B), or the like, or a combination thereof.

Additionally or alternatively, the first conductor 310 and/or the second conductor 320 may have at least one opening (e.g., the first opening 311, the second opening 321). By adjusting the position(s) and/or the number (or count) of the at least one opening, the path along which the electric current flows between the first conductor and the second conductor may be changed. For instance, the greater the size of the coil 300A or the coil 300B, the greater the length of the coil 300A or the coil 300B. As another example, the more the openings are, the greater the length of the coil 300A or the coil 300B.

In some embodiments, the first opening 311 and/or the second opening 321 may be situated at different positions of the coil 300A or the coil 300B. As described above, the length of the transmission line may be associated with the path along which the electric flows. In some embodiments, the smaller a central angle between a center point of the first opening 311 and a center point of the second opening 321 on the arc is, the smaller the frequency of a received magnetic resonance signal. The central angle between a center point of the first opening 311 and a center point of the second opening 321 on the arc may include a value within a range of 0° and 360°, or within a range of 90° and 270°, e.g., 90°, 180°. For example, if a position of the first opening 311 on the arch is designated as 0°, the second opening 321 may be situated at 90° on the arch. As another example, if a position of the first opening 311 on the arch is designated as 0°, the second opening 321 may be situated at 180° on the arch.

According to the transmission line theory, the resonance may be brought about by making a length of the transmission line equal to a half of a wavelength corresponding to the resonance frequency. However, for a current MRI system, the transmission line for bringing about resonance is relatively long, which is unlikely to inflexibly design the receiving coils to suit for examining different portions (e.g., the head, the chest, a leg) of the subject of different sizes. If the first conductor 310 and the second conductor 320 have no opening, the length of the transmission line formed by the first conductor 310 and the second conductor 320 may be a total of a length of the first conductor 310 and a length of the second conductor 320.

In some embodiments of the present disclosure, the coil 300A or the coil 300B described above may have openings (i.e., the first opening 311, the second opening 321), an electric current of the transmission line may be forced to flow back and forth between the first conductor 310 and the second conductor 320 through the openings, and the length of the transmission line formed by the first conductor 310 and the second conductor 320 may be increased. Accordingly, when the resonance occurs between the transmitted MR signal and the received MR signal, the size of the coil 300A or 300B (e.g., a length of the first conductor 310 and/or a length of the second conductor 320) may be reduced, thereby reducing the size of the coil 300A or coil 300B.

It should be noted the descriptions of the opening (i.e., the first opening 311) of the first conductor 310 and/or the opening (i.e., the first opening 311, the second opening 321) of the second conductor 320 are exemplary and non-limiting. In the present disclosure, the first conductor 310 may have at least one opening. The second conductor 320 may include more than two openings.

This description is intended to be illustrative, and not to limit the scope of the present disclosure. Many alternatives, modifications, and variations will be apparent to those skilled in the art. The features, structures, methods, and other characteristics of the exemplary embodiments described herein may be combined in various ways to obtain additional and/or alternative exemplary embodiments.

Figure 4A:
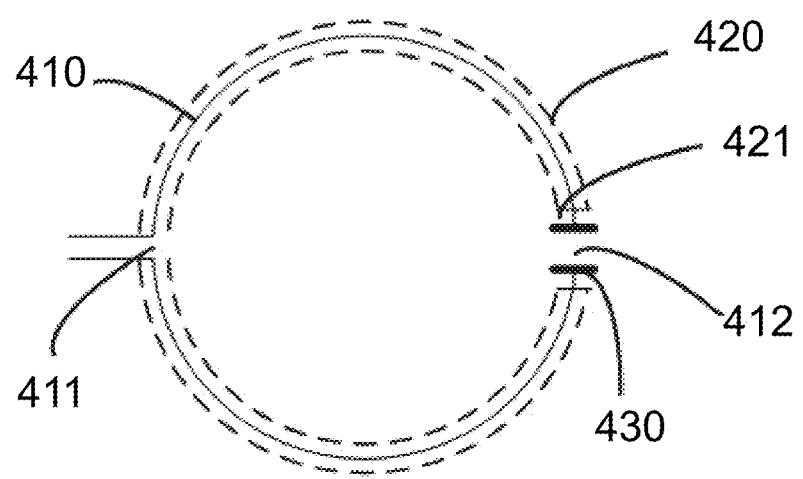
FIGS. 4A-4B are sectional views of exemplary coils for receiving an MR signal according to some embodiments of the present disclosure.
Figure 4B:
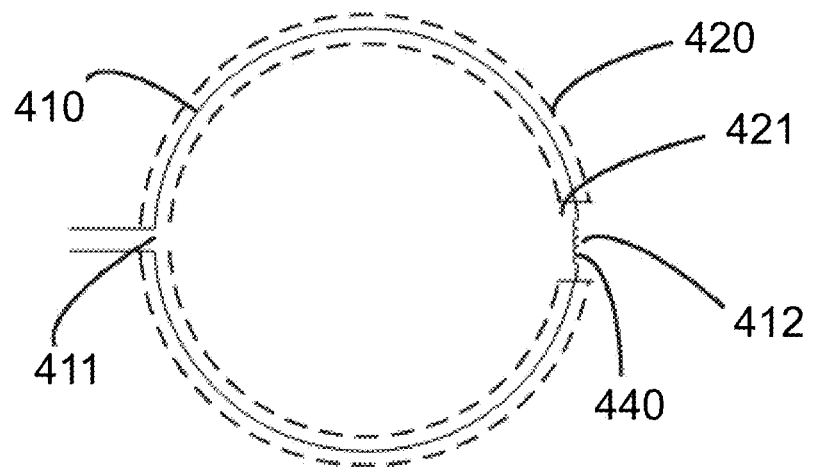

FIGS. 4A-4B are sectional views of exemplary coils for receiving an MR signal according to some embodiments of the present disclosure. The coil 400A or the coil 400B may include a first conductor 410, a first opening 411, a first opening 412, a second conductor 420, and a second opening 421.

The coil 400A and the coil 400B may be examples of the coil 300A. An example of the second electronic component 350 may include a capacitor 430 (as shown in FIG. 4A) or an inductor 440 (as shown in FIG. 4B).

As shown in FIG. 4A, the capacitor 430 may be placed at the first opening 412 and electrically coupled to the first conductor 410. The frequency of the received MR signal may be determined based on Equations (1)-(3) below:

$$f = \frac{1}{2\pi\sqrt{LC_{total}}}, \quad (1)$$

$$\frac{1}{C_{total}} = \frac{1}{C_1} + \frac{1}{C_2}, \quad (2)$$

and $$C_l = \frac{2\pi\varepsilon_0\varepsilon_r}{\ln\left(\frac{D}{d}\right)}, \quad (3)$$

where f represents the frequency of the received MR signal, L represents an inductance of the coil 400A, and $C_{total}$ represents a capacitance of the coil 400A. $C_{total}$ may be determined based on Equation (2), where $C_1$ represents a distributed capacitance generated by a transmission line formed by the first conductor 410 and the second conductor 420, and $C_2$ represents a capacitance of the capacitor 430. $C_1$ may be determined based on Equation (3), where $C_l$ represents of a capacitance per unit length of the transmission line, $\varepsilon_0$ represents a vacuum dielectric constant, $\varepsilon_r$ represents a dielectric constant of an electrically insulating medium between the first conductor 410 and the second conductor 420, D represents a diameter of a circle formed by the second conductor 420 (also referred to as "outer conductor"), and d represents a diameter of a circle formed by the first conductor 410 (also referred to as "inner conductor"). In some embodiments, $C_1$ may be a value on the order of 10 pF. $C_2$ may be a value within the range of 1 pF and 100 pF.

According to Equation (1), the frequency of the received MR signal may be associated with L, $C_1$, and $C_2$. L and $C_1$ may be associated with the length of the transmission line. As described in FIGS. 2A-3B, the length of the transmission line may be associated with the size of the coil 400A or the coil 400B, position(s) of the opening(s) of the coil 400A or the coil 400B, the number (or count) of openings of the coil 400A or the coil 400B, etc. More descriptions can be found elsewhere in the present disclosure. See, e.g., FIGS. 2A-3B and the descriptions thereof.

Figure 5A:
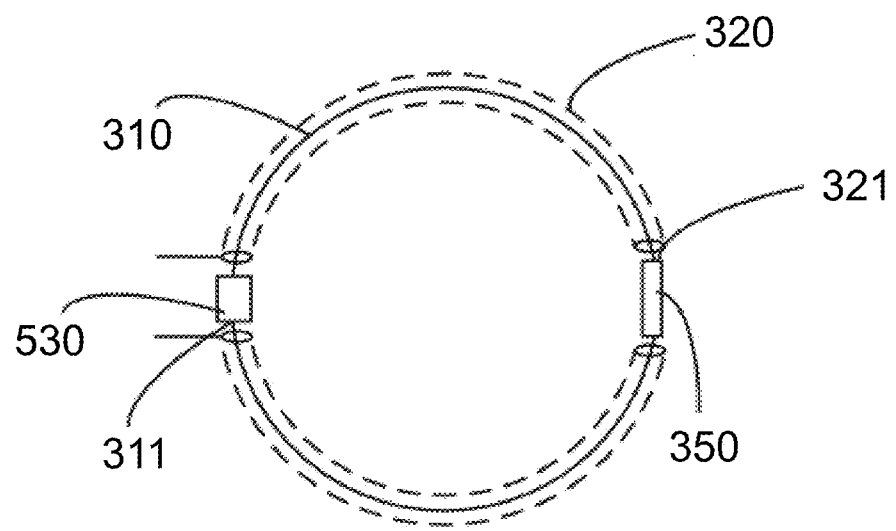
FIGS. 5A-5B are sectional views of an exemplary coil for receiving an MR signal according to some embodiments of the present disclosure.
Figure 5B:
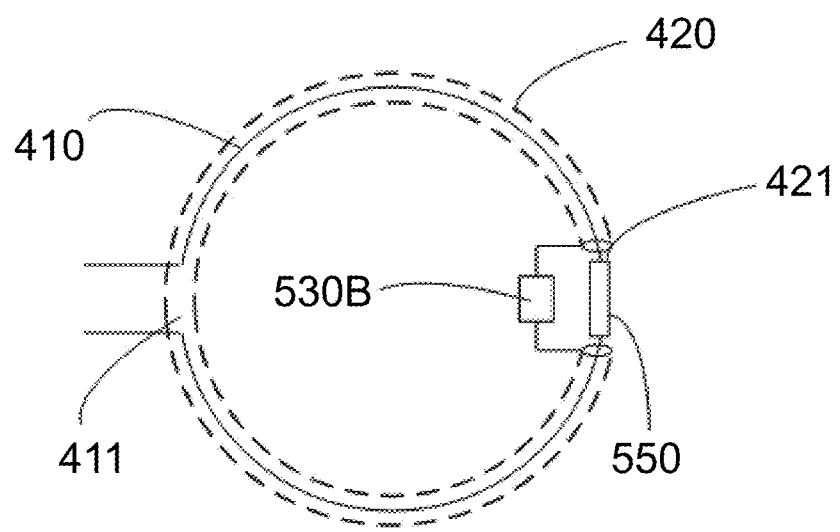

FIGS. 5A-5B are sectional views of exemplary coils for receiving an MR signal according to some embodiments of the present disclosure.

The coil 500A may be the same as or similar to the coil 300B except that the coil 500A may further include a first switching circuit 530. The first switching circuit 530 may be placed at the first opening 311 and electrically coupled to the first conductor 310. The first switching circuit 530 may be configured to receive an external signal to control the first conductor 510 in a short-circuit state. For illustration purposes, if the first switching circuit 530 is open, the first conductor 510 may be nonconductive, and the coil 500A may be in the resonant state with respect to the transmitted MR signal. If the first switching circuit 530 is closed, the first conductor may be conductive and in the short-circuit state, and the coil 500A may be in the detuned state with respect to the transmitted MR signal.

In some embodiments, the second electronic component 350 may further include a second switching circuit placed at the second opening 521. The second switching circuit may be configured to receive a second external signal to control the first conductor 510 in the short-circuit state. Similar to the first switching circuit, the second switch may include a switch diode. The second switching circuit may be electrically coupled to a direct current (DC) circuit. The DC circuit may transmit a DC signal to control a state (e.g., a closed state, an open state) of the switching diode and control the second conductor 520 in the short-circuit state.

The coil 500B may be the same as or similar to the coil 400A or the coil 400B except that the coil 500B may further include a first switching circuit 530B. The first switching circuit 530B may be placed at the second opening 421 and in parallel with a second electronic component 550 (e.g., the capacitor 430, the inductor 440).

Figure 6A:
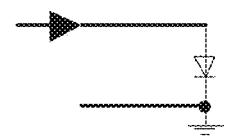
FIG. 6A-6B are two schematic diagrams of switching circuits according to some embodiments of the present disclosure.
Figure 6B:
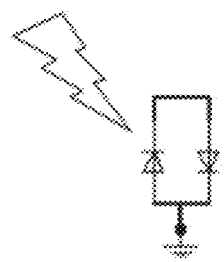

FIGS. 6A-6B are two schematic diagrams of switching circuits according to some embodiments of the present disclosure. The switching circuit 600A and/or the switching circuit 600B may be used as the first switching circuit 530 and/or the second switching circuit described in FIGS. 5A-5B.

As shown in FIG. 6A, the switching circuit 600A may include a switching diode. The switching circuit 600A may be electrically coupled to a direct current (DC) circuit. The DC circuit may transmit a DC signal to control a state (e.g., a closed state, an open state) of the switching diode, thereby controlling a state (e.g., a short-circuit state) of a first conductor (e.g., the first conductor 500A, the first conductor 500B). For instance, if the switching diode is in the closed state, the switching circuit 600A may be conductive, and the first conductor may be in the short-circuit state, and the coil is in the detuned state with respect to the transmitted MR signal. If the switching diode is in the open state, the switching circuit 600A may be open, and the coil is in the resonant state with respect to the transmitted MR signal.

As shown in FIG. 6B, the switching circuit 600B may include two switching diodes electrically coupled in parallel. The switching circuit 600B may receive a radio frequency pulse signal during excitation of the MRI system 100 to control the state of the switching diode to be open or closed to control whether a short circuit of the first conductor 510 exists.

It should to be noted that the first switching circuit 600 may be placed at one of the least one of the openings of the first conductor 510 and the second conductor 520.

Figure 7A:
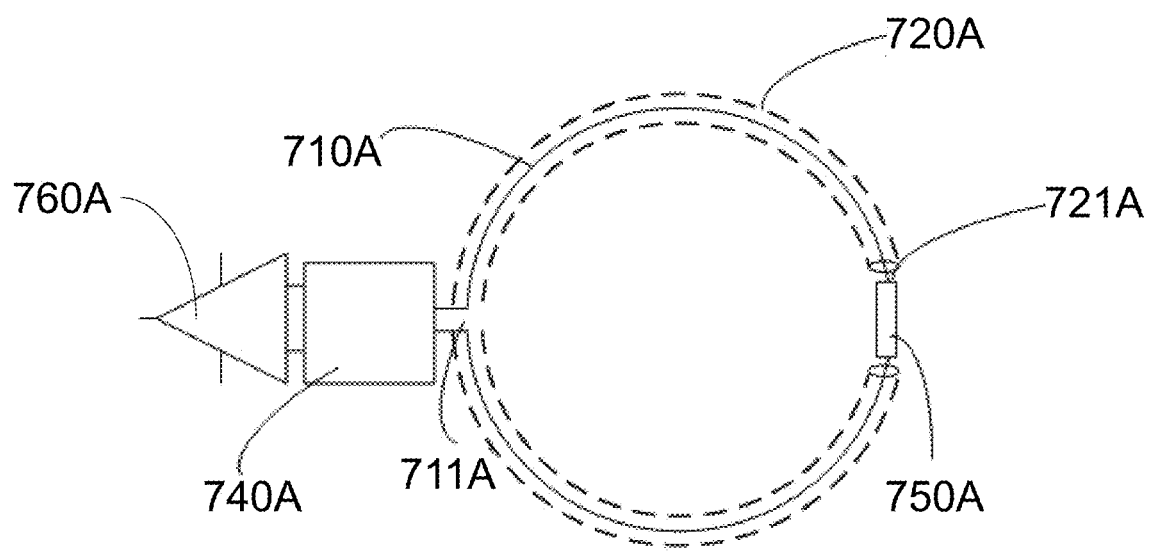
FIGS. 7A-7B are schematic diagrams illustrating exemplary coils for receiving an MR signal according to some embodiments of the present disclosure.

FIG. 7A is a schematic diagram illustrating an exemplary coil for receiving an MR signal according to some embodiments of the present disclosure. The coil 700A may include a first conductor 710A, a first opening 711A, a second conductor 720A, a second opening 721A, a second electronic component 750a, and a matching circuit 740A. The first conductor 710A, the first opening 711A, the second conductor 720A, the second opening 721A may be the same as or similar to the corresponding component described in FIG. 4A or FIG. 4B, respectively.

The second electronic component 750A may be the same as or similar to the second electronic component 350 described in FIG. 3A or FIG. 3B. The second electronic component 750A may further include a matching circuit 740A or an amplifier 760A. The matching circuit 740A may include an integrated component configured to adjust the frequency of a received MR signal of the coil 700A. In some embodiments, a first end of the matching circuit 740A may be electrically coupled to the first conductor 710A, and a second end of the matching circuit 740A may be electrically coupled to the amplifier 760A. The amplifier 760A may be configured to amplify the received MR signal flowing through the matching circuit 740A and output the amplified MR signal.

In some embodiments, the matching circuit 740A may be placed at a power feeder board. Two ends of the first opening 711A may be electrically coupled to the power feeder board. The power feeder board may be configured to feed back the received MR signal to the amplifier 760 and a back end radio frequency receiving chain. In some embodiments, the matching circuit 740A may be placed at the second opening 721A. An additional opening may be situated at the second conductor 720A, and the matching circuit 740A may be placed at the additional opening.

Figure 7B:
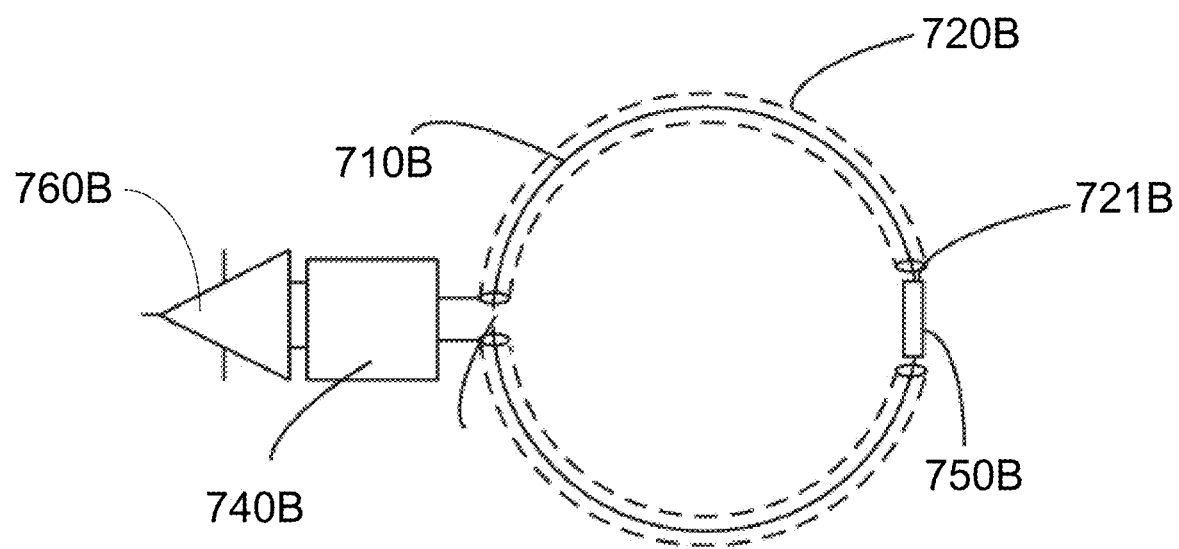

FIG. 7B is a schematic diagram illustrating an exemplary coil for receiving an MR signal according to some embodiments of the present disclosure. The coil 700B may include a first conductor 710B, a first opening 711B, a second conductor 720B, a second opening 721B, a second electronic component 750B, and a matching circuit 740B. The first conductor 710B, the first opening 711B, the second conductor 720B, the second opening 721B may be the same as or similar to the corresponding component described in FIG. 4A or FIG. 4B, respectively.

Different from the coil 700A, the second conductor 720B may be open at the first opening 711B, and the third electronic component may be placed at the first opening 711B and electronically coupled to the second conductor 720B. Compared to the coil 700A, a path along which an electric current flows between the first conductor 710B and the second conductor 720B may be changed, and the frequency of the received MR signal may be changed accordingly. Since the coil 700B may have more openings than the coil 700A, the frequency of the received MR signal may be greater than the frequency of the MR signal.

Figure 8:
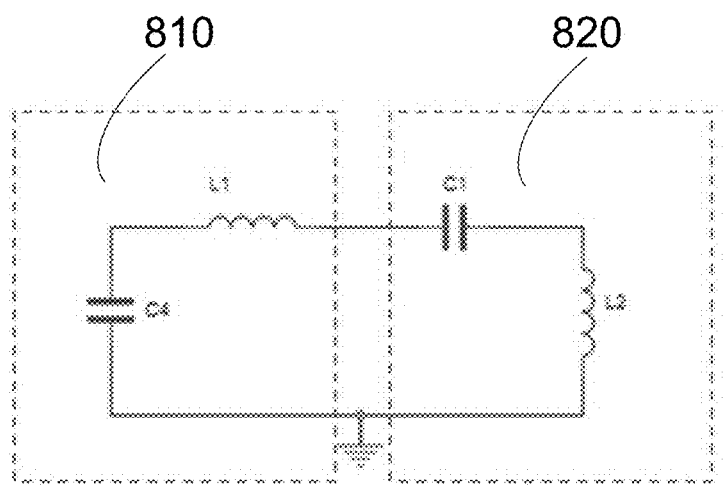
FIG. 8 is a schematic diagram illustrating an exemplary matching circuit according to some embodiments of the present disclosure.

FIG. 8 is a schematic diagram illustrating an exemplary matching circuit according to some embodiments of the present disclosure. The matching circuit 800 is an example of the matching circuit 740A or the matching circuit 740B.

The matching circuit 800 may include a coil matching unit 810 and an amplifier unit 820. As shown in FIG. 8, the coil matching unit 810 may include an inductor $L_1$ and a capacitor $C_4$. The amplifier unit 820 may include an inductor $L_1$ and a capacitor $C_1$. It should be noted parameters (e.g., a capacitance, an inductance) of the electrical components (e.g., $L_1$, $C_4$, $L_2$, $C_1$) described herein may be set according to practical demands, e.g., parameters of the coil and the amplifier described in FIG. 7A or FIG. 7B. In some embodiments, a capacitance of $L_2$ may be 100 nH. An inductance of $C_1$ may be 20 pF. An inductance of $C_4$ and a capacitance of $L_1$ may be determined based on a loading state of a coil (e.g., placed on a surface of a subject). The inductance of $C_4$ may be adjusted based on Equation (4) below:

$$Z_{out} = \frac{(1/\omega C_4)^2}{r_{load}}, \quad (4)$$

where $Z_{out}$ represents an output impedance of the coil, co represents a resonant angular frequency of the coil, and $r_{load}$ represents a load resistance. As used herein, $Z_{out}$ may be a characteristic impedance of a typical amplifier, e.g., 500 hm. $r_{load}$ may be a value in the order of 100 hm.

Figure 9:
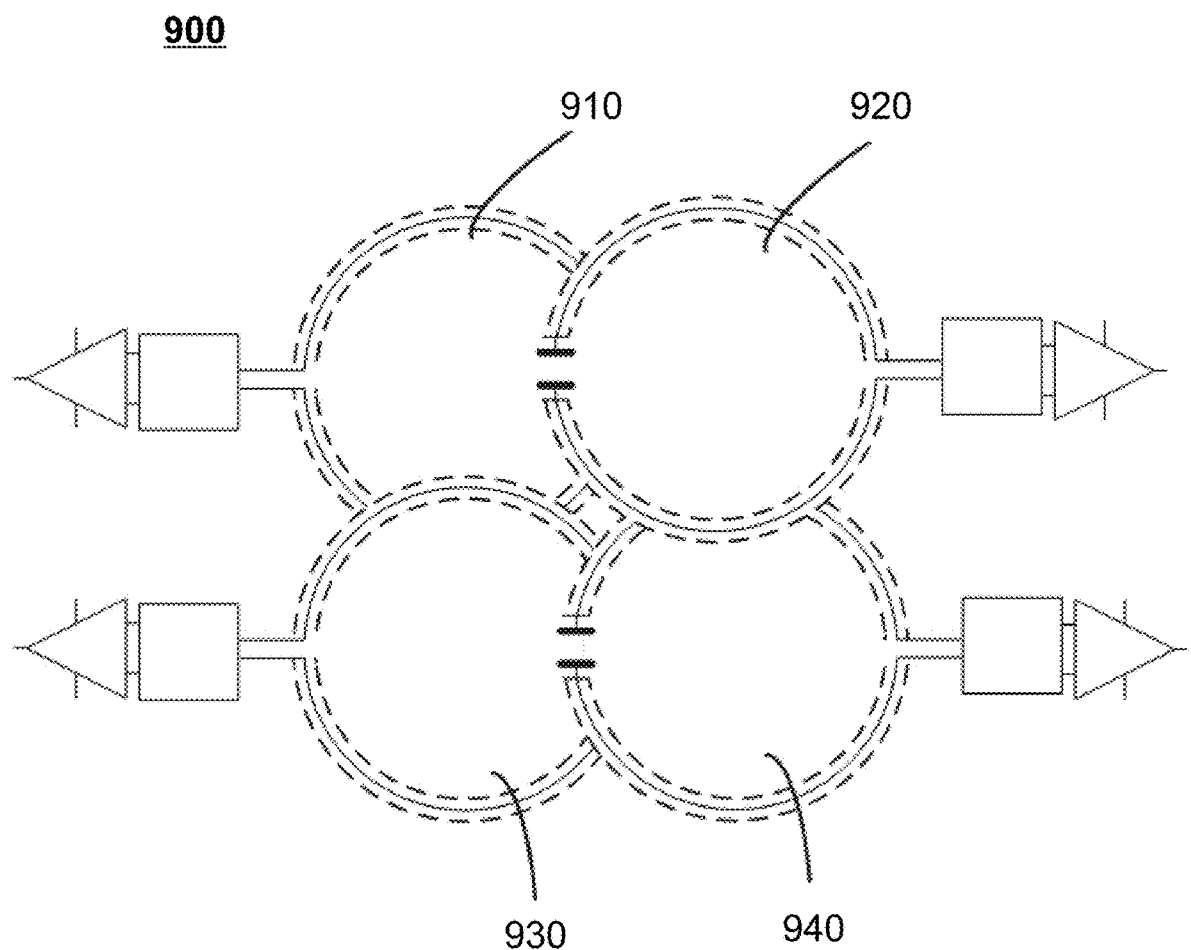
FIG. 9 is a schematic diagram illustrating an exemplary coil assembly according to some embodiments of the present disclosure.

FIG. 9 is a schematic diagram illustrating an exemplary coil assembly according to some embodiments of the present disclosure.

The coil assembly 900 may include four coils and the four coils may include a first coil 910, a second coil 920, a third coil 930, and a fourth coil 940. At least one of the four coils may have the structure of the coils described in FIGS. 3A-7B. The first coil 910 and the second coil 920 may form a first coil group placed in a first row. The third coil 930 and the fourth coil 940 may form a second coil group placed in a second row. The first coil 910 and the third coil 930 may form a first column. The second coil 920 and the fourth coil 940 may form a second column. Coils in the same row or the same column may partially overlap, i.e., the coils in the coil assembly may be stacked for decoupling, which may reduce mutual inductance between the coils. For instance, the coil assembly may include four coils of which two are placed on the top of the other as illustrated in, e.g., FIG. 9. In some embodiments, ways of the decoupling may also include a capacitively decoupling mode, an inductively decoupling mode, or the like, or a combination thereof.

Each of the four coils may include a first opening and be electrically coupled to a matching circuit and an amplifier through the first opening. In some embodiments, the first opening may be electrically coupled to the matching circuit. The matching circuit may be configured to adjust the frequency of a received MR signal of the coil, and the amplifier may be configured to amplify the received MR signal flowing through the matching circuit and output an amplified MR signal.

In some embodiments, the first coil 910, the second coil 920, the third coil 930, and the fourth coil 940 may also have a third opening, respectively. The third opening may be electrically coupled to an electronic component (e.g., a capacitor, an inductor, a switching circuit).

It should be noted that the number (or count) of coils in the coil assembly in the present disclosure may be non-limiting, and be set as five, six or more. The structures of the coils may be the same or different. The shape of the coil assembly may be non-limiting, and set as a dome shape, a cylindrical shape, an arc shape, etc. In some embodiments, the coil assembly may be used as a head coil, a spinal coil, a limb joint coil, a shoulder coil, an abdominal coil, a neck coil, a shoulder coil, etc. For illustration purposes, if the coil assembly is used as the head coil, the coil assembly may have the shape of a partial sphere. If the coil assembly is used as the spinal coil or the body coil, the coil assembly may have a planar structure. If the coil assembly is used as the joint coil, e.g., a shoulder joint coil, a knee joint coil, an ankle joint coil, a wrist joint coil, etc., the structure of the coil assembly may be designed according to a specific shape of the portion of the subject to be scanned.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A non-transitory computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C #, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities, properties, and so forth, used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/ or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A coil for receiving a magnetic resonance signal, comprising:
   a first conductor; and
   a second conductor electrically coupled to the first conductor, wherein the first conductor and the second conductor form a coaxial structure and the first conductor is situated at a center region of the coaxial structure, and wherein:
   the first conductor is a solid wire conductor that has at least one first opening and at least one third opening, wherein each of the first opening and the third opening comprises a first end and a second end of the first conductor, and wherein the at least one first opening is configured as an output of the coil;
   the second conductor has at least one second opening, wherein each of the second opening comprises a first end and a second end of the second conductor, and the at least one second opening of the second conductor and the at least one third opening of the first conductor are located at the same position;
   the first conductor and the second conductor are electrically coupled using an electronic component placed at the at least one third opening so that an electric current flows between the first conductor and the second conductor through the electronic component, the electronic component being in series with the first conductor by connecting the first end and the second end of the at least one third opening of the first conductor, the electronic component including a matching circuit; and
   a switching circuit is placed at the at least one second opening and in parallel with the electronic component to adjust the coil to a detuned state or a resonant state.

2. The coil of claim 1, wherein the electronic component includes at least one of a capacitor or an inductor.

3. The coil of claim 1, wherein the electronic component is configured to adjust a frequency of the received magnetic resonance signal.

4. The coil of claim 3, wherein a capacitance of the capacitor is adjustable, or an inductance of the inductor is adjustable.

5. The coil of claim 3, wherein the electronic component is placed at one of the at least one second opening.

6. The coil of claim 1, wherein the coil is further electrically coupled to a third electronic component through one of the at least one first opening of the first conductor.

7. The coil of claim 6, wherein the third electronic component is electrically coupled to the first conductor through the first opening of the first conductor.

8. The coil of claim 6, wherein the third electronic component is electrically coupled to the second conductor through the at least one first opening of the first conductor.

9. The coil of claim 1, wherein the first conductor has a shape of an arc, a rectangle, a butterfly shape, a saddle shape, an annular shape, a ring-like shape, or a polygon.

10. The coil of claim 1, wherein a gap exists between the first conductor and the second conductor, and wherein the gap is filled with a dielectric medium.

11. The coil of claim 10, wherein the dielectric medium includes at least one of air, ceramic, polymer, or a crystalline material.

12. The coil of claim 1, wherein a location of one of the at least one first opening relative to one of the at least one second opening is adjustable.

13. The coil of claim 1, wherein the at least one first opening configured as the output of the coil is electrically coupled to an amplifier.

14. The coil of claim 13, wherein the amplifier is configured to amplify an MR signal received through the matching circuit and output an amplified MR signal.

15. The coil of claim 1, wherein the matching circuit is configured to match an output impedance of the coil to a characteristic impedance of an amplifier.

16. The coil of claim 1, wherein the matching circuit includes a coil matching unit and an amplifier unit.

17. The coil of claim 16, wherein the coil matching unit includes a first inductor and a first capacitor, and the amplifier unit includes a second inductor and a second capacitor.

18. A coil assembly for receiving a magnetic resonance (MR) signal, wherein the coil assembly includes a plurality of coils, and at least one of the plurality of coils includes:
   a first conductor; and
   a second conductor electrically coupled to the first conductor, wherein the first conductor and the second conductor form a coaxial structure and the first conductor is situated at a center region of the coaxial structure, and wherein:
   the first conductor is a solid wire conductor that has at least one first opening and at least one third opening, wherein each of the first opening and the third opening comprises a first end and a second end of the first conductor, and wherein the at least one first opening is configured as an output of the coil;
   the second conductor has at least one second opening, wherein each of the second opening comprises a first end and a second end of the second conductor, and the at least one second opening of the second conductor and the at least one third opening of the first conductor are located at the same position;
   the first conductor and the second conductor are electrically coupled using an electronic component placed at the at least one third opening so that an electric current flows between the first conductor and the second conductor through the electronic component, the electronic component being in series with the first conductor by connecting the first end and the second end of the at least one third opening of the first conductor, the electronic component including a matching circuit; and
   a switching circuit is placed at the at least one second opening and in parallel with the electronic component to adjust the coil to a detuned state or a resonant state.

19. The coil assembly of claim 18, wherein the plurality of coils form a planar shape, a dome shape, a cylindrical shape or an arc shape.

20. A magnetic resonance imaging system, comprising:
   a magnet configured to form a detection space;
   a table configured to support a subject to be examined inside the detection space; and
   a coil assembly configured to receive a magnetic resonance signal generated by the subject when the subject is examined, wherein the coil assembly includes a plurality of coils, and at least one of the plurality of the coils includes:
   a first conductor; and
   a second conductor electrically coupled to the first conductor, wherein the first conductor and the second conductor form a coaxial structure and the first conductor is situated at a center region of the coaxial structure, and wherein:
   the first conductor is a solid wire conductor that has at least one first opening and at least one third opening, wherein each of the first opening and the third opening comprises a first end and a second end of the first conductor, and wherein the at least one first opening is configured as an output of the coil;
   the second conductor has at least one second opening, wherein each of the second opening comprises a first end and a second end of the second conductor, and the at least one second opening of the second conductor and the at least one third opening of the first conductor are located at the same position;
   the first conductor and the second conductor are electrically coupled using an electronic component placed at the at least one third opening so that an electric current flows between the first conductor and the second conductor through the electronic component, the electronic component being in series with the first conductor by connecting the first end and the second end of the at least one third opening of the first conductor, the electronic component including a matching circuit; and
   a switching circuit is placed at the at least one second opening and in parallel with the electronic component to adjust the coil to a detuned state or a resonant state.

* * * * *